US008202779B2

(12) United States Patent
Fang et al.

(10) Patent No.: US 8,202,779 B2
(45) Date of Patent: Jun. 19, 2012

(54) METHODS FOR FORMING A MEMORY CELL HAVING A TOP OXIDE SPACER

(75) Inventors: Shenqing Fang, Fremont, CA (US); Angela Hui, Fremont, CA (US); Gang Xue, Sunnyvale, CA (US); Alexander Nickel, Santa Clara, CA (US); Kashmir Sahota, Fremont, CA (US); Scott Bell, San Jose, CA (US); Chun Chen, San Jose, CA (US); Wai Lo, Palo Alto, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/891,310

(22) Filed: Sep. 27, 2010

(65) Prior Publication Data

US 2011/0233647 A1 Sep. 29, 2011

Related U.S. Application Data

(63) Continuation-in-part of application No. 11/653,649, filed on Jan. 12, 2007, now Pat. No. 7,803,680.

(51) Int. Cl.
*H01L 21/336* (2006.01)

(52) U.S. Cl. ......... 438/257; 438/197; 257/314; 257/315

(58) Field of Classification Search .................. 257/314, 257/315; 438/197, 257
See application file for complete search history.

(56) References Cited

U.S. PATENT DOCUMENTS

| | | | |
|---|---|---|---|
| 6,159,801 | A | 12/2000 | Hsieh et al. |
| 6,555,427 | B1 | 4/2003 | Shimizu et al. |
| 7,067,377 | B1 | 6/2006 | Park et al. |
| 2007/0001211 | A1 | 1/2007 | Lee |

*Primary Examiner* — Kiesha Bryant
*Assistant Examiner* — Marvin Payen

(57) ABSTRACT

Methods for fabricating a semiconductor memory cell that has a spacer layer are disclosed. A method includes forming a plurality of source/drain regions in a substrate where the plurality of source/drain regions are formed between trenches, forming a first oxide layer above the plurality of source/drain regions and in the trenches, forming a charge storage layer above the oxide layer and separating the charge storage layer in the trenches where a space is formed between separated portions of the charge storage layer. The method further includes forming a spacer layer to fill the space between the separated portions of the charge storage layer and to rise a predetermined distance above the space. A second oxide layer is formed above the charge storage layer and the spacer layer and a polysilicon layer is formed above the second oxide layer.

7 Claims, 11 Drawing Sheets

METHODS FOR FORMING A MEMORY CELL HAVING A TOP OXIDE SPACER

RELATED APPLICATIONS

This application is a Continuation-In-Part of U.S. patent application Ser. No. 11/653,649, filed on Jan. 12, 2007, by Fang et al., entitled "Self-Aligned Patterning Method by Using Non-Conformal Film and Etch Back for Flash Memory and Other Semiconductor Applications" which is hereby incorporated herein by reference in its entirety.

BACKGROUND

Consumer electronic products such as televisions, digital cameras, cellular telephones, media content players, etc., are designed, manufactured and marketed for the purpose of satisfying the substantial consumer demand for basic communications and entertainment services. Data storage components play an important role in the operation of such devices. Data storage devices can include RAM, ROM, flash memory devices, etc.

Flash memory is non-volatile computer memory that can be electrically erased and reprogrammed. Flash memory is primarily used in memory cards and USB flash drives for general storage and transfer of data between computers and other digital products. Flash memory is a specific type of EEPROM (Electrically Erasable Programmable Read-Only Memory) that is erased and programmed in large blocks. Example applications include data storage for PDAs (personal digital assistants), laptop computers, digital audio players, digital cameras and mobile phones. Other applications include game consoles, where flash memory can be used instead of other types of EEPROMs or battery-powered SRAM for game save data.

Flash memory is typically made up of an array of floating gate transistors that form respective memory cells of the array. One or more bits of data can be stored as charge by each of the memory cells. SONOS type flash memory cells include a silicon substrate that includes silicon oxide formed over portions of the silicon substrate, a layer of silicon oxide formed over the silicon portions, a layer of silicon nitride formed on the layer of silicon oxide, an upper layer of silicon oxide formed on the layer of silicon nitride, and a layer of electrically conductive material formed on the upper layer of silicon oxide. The lower silicon oxide layer, the silicon nitride layer and the upper silicon oxide layer (ONO stack) form a charge trapping dielectric structure.

FIG. 1 shows a cross sectional view of a portion of a memory cell array 100 that includes a SONOS structure. Memory cell array 100 includes a polysilicon wordline 101 that includes portions with sharp corners 103. The sharp cornered portions 103 are disposed in close proximity to isolation regions 107 that separate charge storage elements 109 in trenches which are associated with adjacent memory cells.

The memory cell configuration shown in FIG. 1 has significant shortcomings that can result in a degradation of performance of a memory cell array. Sharp polysilicon cornered portions 103 create a high electrical field that can cause the injection of electrons during erase operations and degrade core cells. Moreover, polysilicon material that is formed deep inside the trench is extremely difficult to remove during wordline definition. If such polysilicon is not removed it can result in an unintended and undesirable pathway for leakage current between adjacent memory cells that can cause the device to fail.

SUMMARY OF THE INVENTION

Methods for fabricating a semiconductor memory cell that has a spacer layer are disclosed. A method includes forming a plurality of source/drain regions in a substrate where the plurality of source/drain regions are formed between trenches, forming a first oxide layer above the plurality of source/drain regions and in the trenches, forming a charge storage layer above the oxide layer and separating the charge storage layer in the trenches where a space is formed between separated portions of the charge storage layer. The method further includes forming a spacer layer to fill the space between the separated portions of the charge storage layer and to rise a predetermined distance above the space. A second oxide layer is formed above the charge storage layer and the spacer layer and a polysilicon layer is formed above the second oxide layer.

BRIEF DESCRIPTION OF THE DRAWINGS

The invention, together with further advantages thereof, may best be understood by reference to the following description taken in conjunction with the accompanying drawings in which.

It should be noted that like reference numbers refer to like elements in the figures.

DETAILED DESCRIPTION OF THE INVENTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

Figure 1:
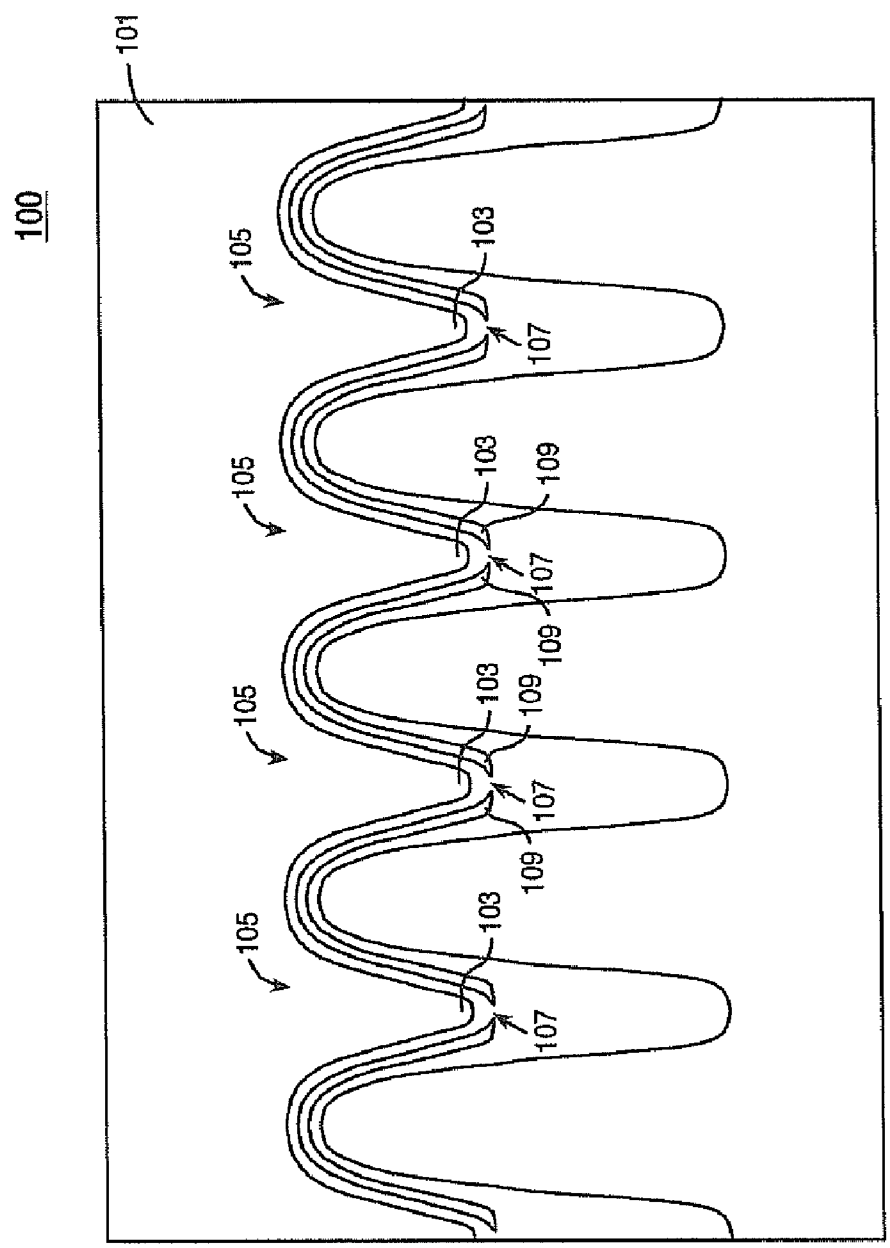
FIG. 1 shows a cross sectional view of a portion of a memory cell array that includes memory cells having a silicon-oxide-nitride-oxide-silicon (SONOS) structure.
Figure 2A:
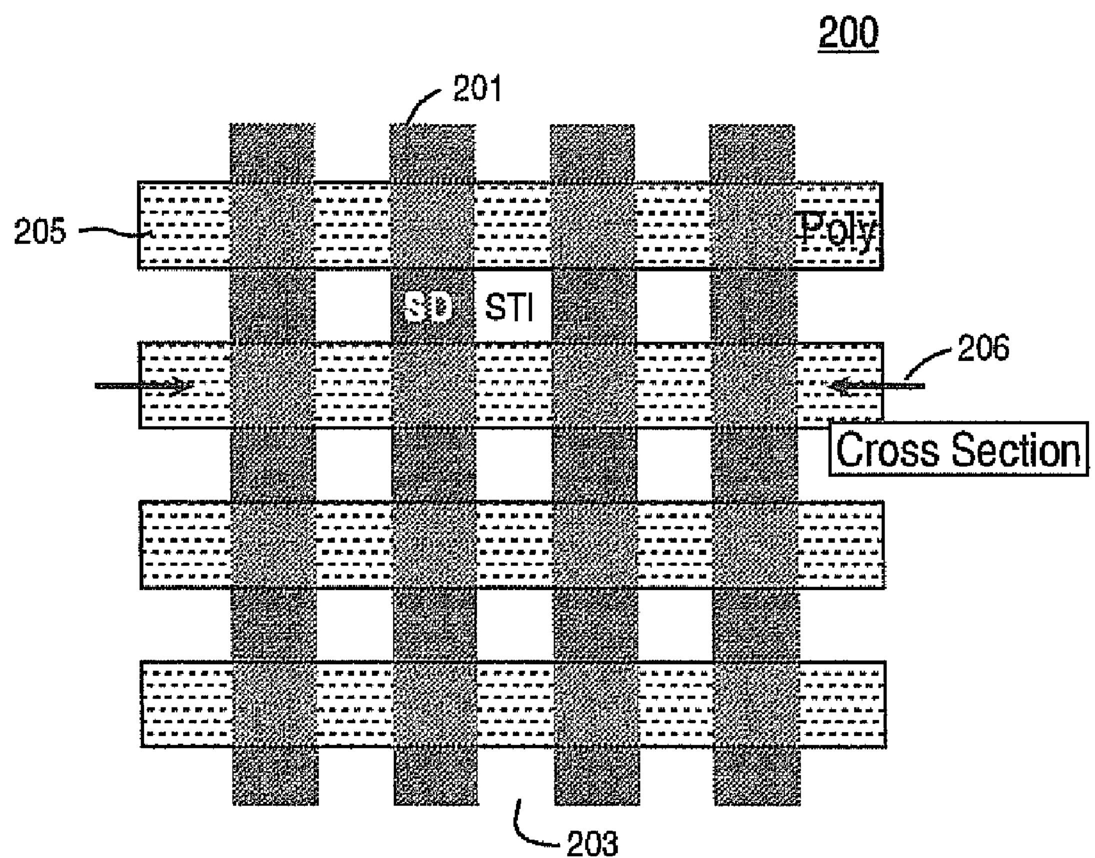
FIG. 2A shows an exemplary memory cell array operating environment of memory cells that are formed to include a top oxide spacer according to one embodiment.

Exemplary Operating Environment of Memory Cell Having A Top Oxide Spacer According To One Embodiment of the Present Invention FIG. 2A shows a top view of an exemplary memory cell array 200 according to one embodiment. In one embodiment, memory cell array 200 includes memory cells that include a top oxide spacer element (see FIG. 2B and accompanying discussion below). In one embodiment, the memory cells of memory cell array 200 may have a silicon-oxide-nitride-oxide-silicon (SONOS) structure (see FIG. 2B). Moreover, in one embodiment, memory cell array 200 features a grid of transistor memory cells which can be connected by horizontal and vertical control lines to periphery circuitry such as address decoders and sense amplifiers (not shown). Referring to FIG. 2A, memory cell array 200 includes source-drain structures 201, shallow trench isolation (STI) regions 203 and polysilicon wordlines 205. Reference number 206 identifies the point from which the cross section shown in FIG. 2B is taken.

Because each memory cell of memory cell array 200 is positioned adjacent other memory cells that are a part of memory cell array 200, the proximity of adjacent memory cells, if not addressed, could make each memory cell of memory cell array 200 susceptible to electric fields and electron injections that emanate from adjacent memory cells. These electric fields and electron injections can degrade core cells. As described in detail herein (see description of the memory cell structure made below with reference to FIG. 2B), each of the memory cells of memory cell array 200 employs a top oxide spacer. This structure suppresses creation of high electric fields, injection of electrons during erase operations and degradation of core cells.

Memory Cell Having A Top Oxide Spacer

Figure 2B:
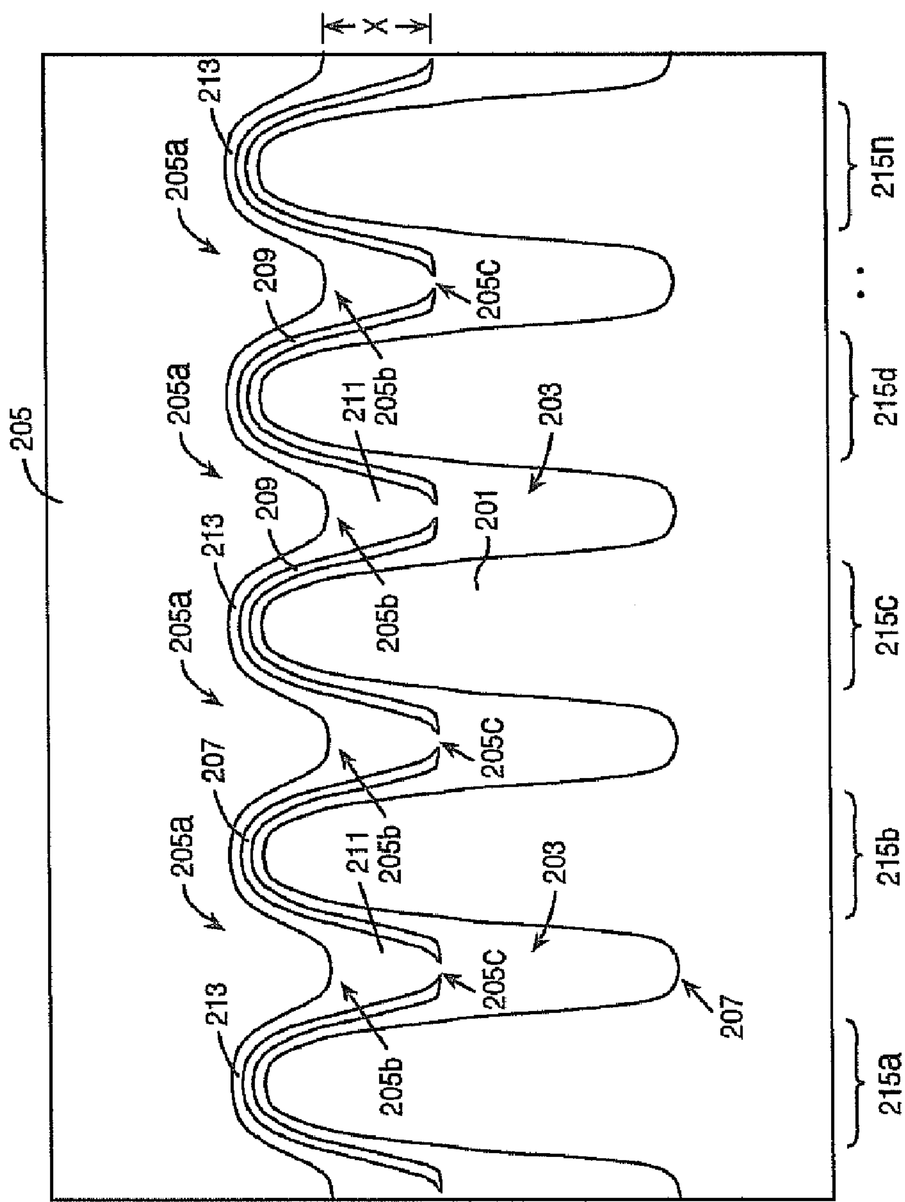
FIG. 2B shows a cross sectional view of a memory cell array that includes memory cells having a top oxide spacer according to one embodiment.

FIG. 2B shows a cross sectional view of memory cell array 200 according to one embodiment. The cross sectional view shows that polysilicon wordline 205 includes portions 205*a* that are formed to extend into trenches 207 that are located between memory cells 215*a-n*. In one embodiment, polysilicon wordline portions 205*a* can extend into trenches 207 to a depth of 100 to approximately 1500 angstroms. In one embodiment, polysilicon wordline portions 205*a* include blunt (not sharp) end portions 205*b* that are disposed to face an isolation region 205*c* that separates charge storage structures 209 in trenches 207. The blunt polysilicon wordline end portions 205*b* that are formed in trenches 207 are positioned a predetermined distance away from the isolation regions 205*c* that separate charge storage elements 209 inside trenches 207. In one embodiment, insulation film 211 operates as a top oxide spacer that facilitates the positioning of the polysilicon wordline portions 205*b* a predetermined distance X away from isolation regions 205*c*. In one embodiment, the thickness of the top oxide spacer can be 10 to approximately 1000 angstroms. Forming blunt polysilicon wordline end portions 205*b* in this manner with respect to isolation regions 205*c* suppresses the creation of high electric fields, the injection of electrons during erase operations and the degradation of core cells. Moreover, because the polysilicon from which polysilicon wordline portions 205*a* are formed only extends to a predetermined depth in trenches 207, difficulties typically encountered in etching away polysilicon that is lodged inside of deep trenches is avoided (e.g., during the wordline definition).

In the FIG. 2B embodiment, memory cells 215*a-n* include source-drain structures 201, STI/oxide layer 203, polysilicon wordline 205, trenches 207, charge storage elements 209, insulation film 211 and top oxide layer 213. Referring to FIG. 2B, STI/oxide layer 203 is formed inside trenches 207 to a predetermined height, and to cover the upper sidewalls and top surfaces of source-drain structures 201. Charge storage elements 209 are formed on the portions of STI/oxide layer 203 that cover the upper sidewalls and top surfaces of source-drain structures 201. In one embodiment, charge storage elements 209 may be formed from SiRN. In other embodiments, charge storage elements 209 may be formed from other materials. Insulation film 211 is formed to rise a predetermined distance above the space between respective charge storage structures 209 inside trenches 207. Moreover, top oxide layer 213 is formed above insulation film 211 and above the portions of charge storage structures 209 that are formed on the portions of STI/oxide 203 that cover the upper sidewalls and top surfaces of source-drain structures 201. As discussed above, polysilicon layer 205 is formed above top oxide layer 213 and includes blunt end portions 205*a* that extend into the upper portions of trenches 207 to a predetermined depth.

In operation, in one embodiment, a combination of voltages can be applied to the terminals of individual memory cells 215*a-n* of the memory cell array 200 in order to store, read or erase data. Voltages applied for such purposes may affect adjacent memory cells. However, the top oxide spacer structure (insulation film 211) of exemplary embodiments suppresses the creation of high electric fields and the injection of electrons during erase operations and thus the degradation of core cells. The high current levels (high signal to noise ratio) that are generated facilitates improved memory cell density, operating speed, sense accuracy, efficiency and operating range. Moreover, the high current levels enable the use of embodiments in memory applications that can include but are not limited to NAND and NOR.

Process Flow For Forming Memory Cells Having A Top Oxide Spacer

FIGS. 3A-3G show a series of memory cell cross sections illustrating a process flow that is involved in forming memory cells having a top oxide spacer according to one embodiment of the invention. Although specific operations are discussed with reference to the cross sections, such operations are exemplary. That is the present invention is well suited to performing various other operations or variations of the operations discussed with reference to the memory cell cross sections.

Figure 3A:
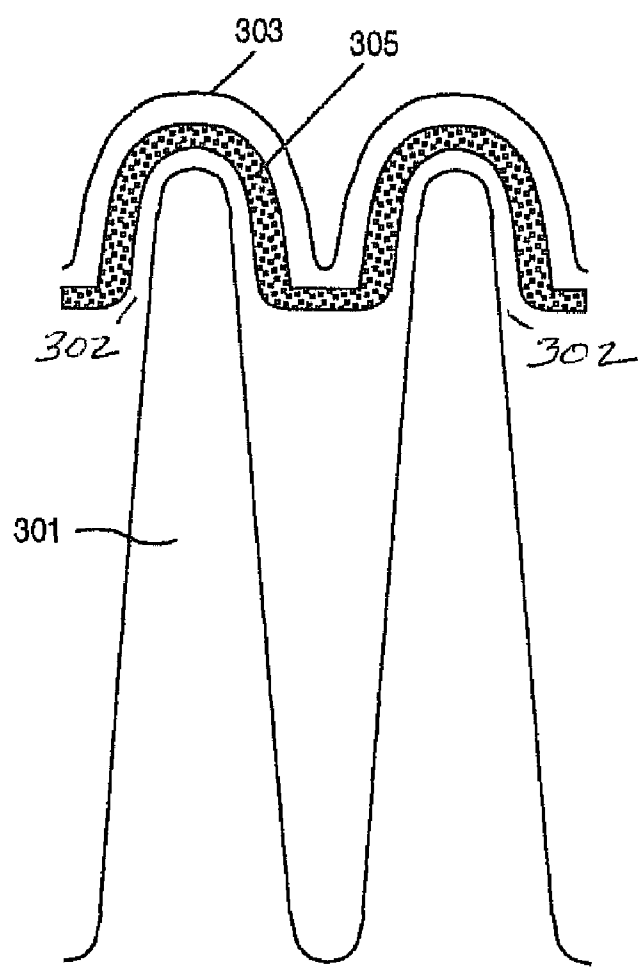
FIG. 3A shows a cross sectional view of a portion of a memory cell array after a thin sacrificial top oxide is formed above charge storage material that is formed above a source-drain structure according to one embodiment.

Referring to FIG. 3A, in an initial operation, a thin sacrificial top oxide 303 is formed above a charge storage material 305 that is formed above a bottom oxide layer 302 formed on source-drain structures 301. The processes used to form source-drain structures 301 and charge storage material 305 are described in detail in U.S. patent application Ser. No. 11/653,649, filed on Jan. 12, 2007, by Fang et al., entitled "Self-Aligned Patterning Method by Using Non-Conformal Film and Etch Back for Flash Memory and Other Semiconductor Applications" which is incorporated herein by reference in its entirety. In one embodiment, thin sacrificial top oxide 303 can be formed by processes that include but are not limited to SPA, TEOS, and HTO.

Figure 3B:
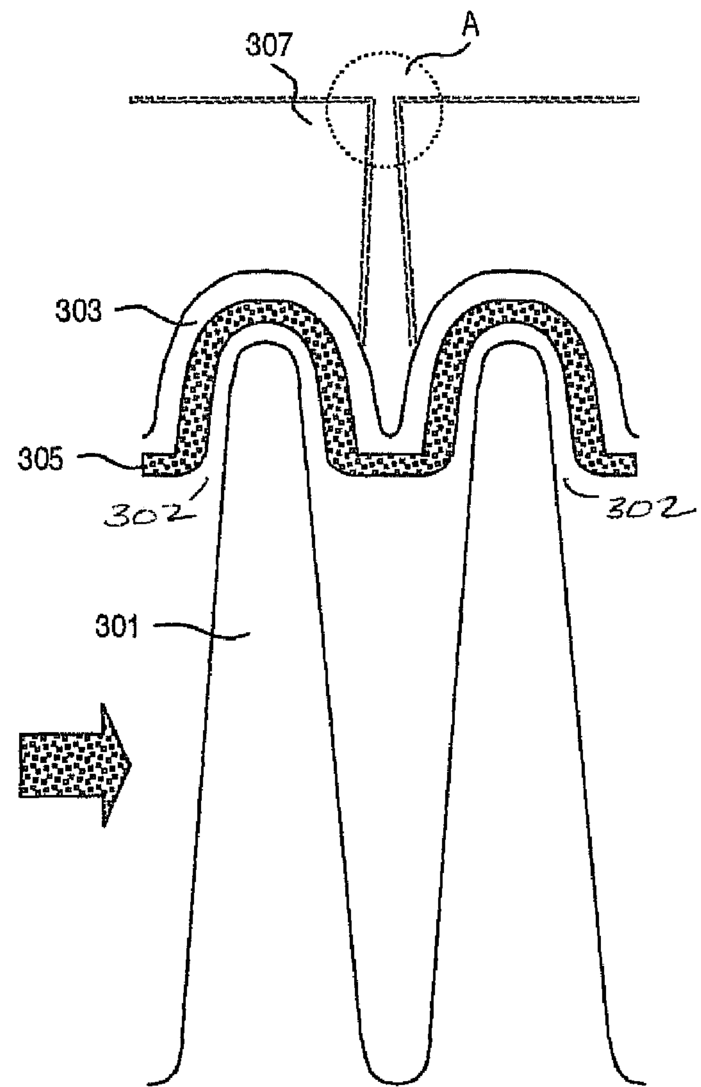
FIG. 3B shows a cross sectional view of the structure shown in FIG. 3A after a non-conformal oxide is formed above material formed on source-drain structures of adjacent memory cells according to one embodiment.

As shown in FIG. 3B, subsequent to the execution of one or more operations that result in the cross section shown in FIG. 3A, a non-conformal oxide 307 is formed on top of thin sacrificial top oxide 303 and charge storage material 305 (formed above source-drain structures 301). In one embodiment, the deposition of non-conformal oxide 307 is terminated before oxide deposited above adjacent source-drain structures 301 makes contact or "pinch off" (see "A" in FIG. 3B). In another embodiment (optional), non-conformal oxide 307 can be deposited until the oxide deposited above adjacent source-drain structures 307 make contact. In this embodiment, subsequently, a wet etch of the pinch-off may be performed (optional). In one embodiment, residual oxide may remain after the wet etch of the pinch-off.

Figure 3C:
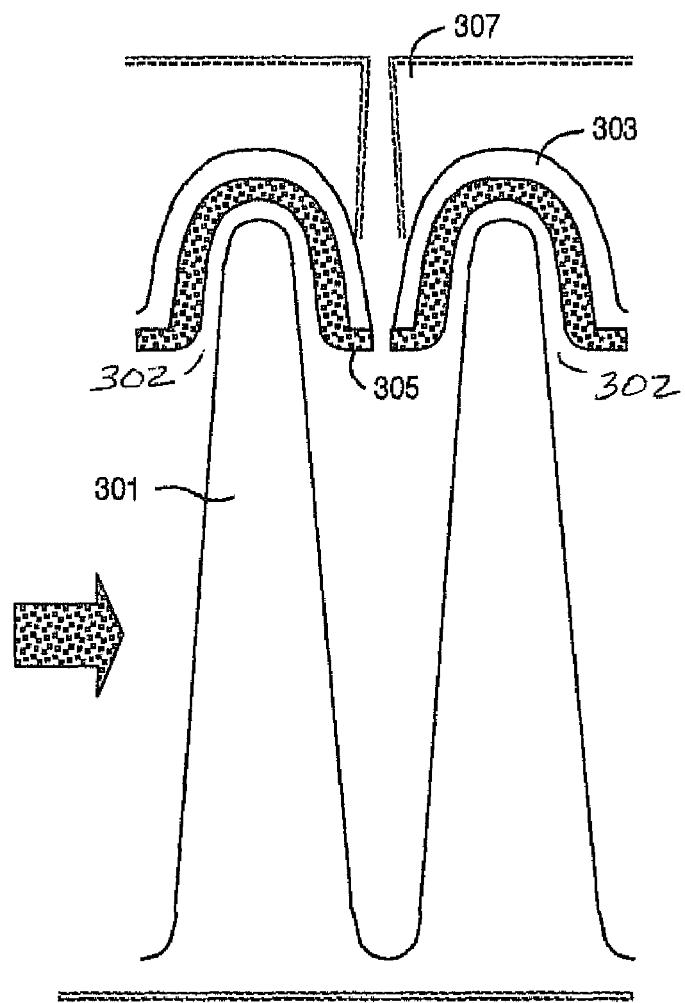
FIG. 3C shows a cross sectional view of the structure shown in FIG. 3B after the charge storage material has been etched in the region between memory cells according to one embodiment.

As shown in FIG. 3C, subsequent to the execution of one or more operations that result in the cross section shown in FIG. 3B, a wet or dry etch of charge storage material 305 between core cells for isolation purposes is performed (isolation etch). This etch separates the charge storage material 305 such that charge storage elements for respective memory cells are formed. Moreover, as a consequence of the aforementioned one or more operations the memory cells that correspond to the respective charge storage elements are isolated.

Figure 3D:
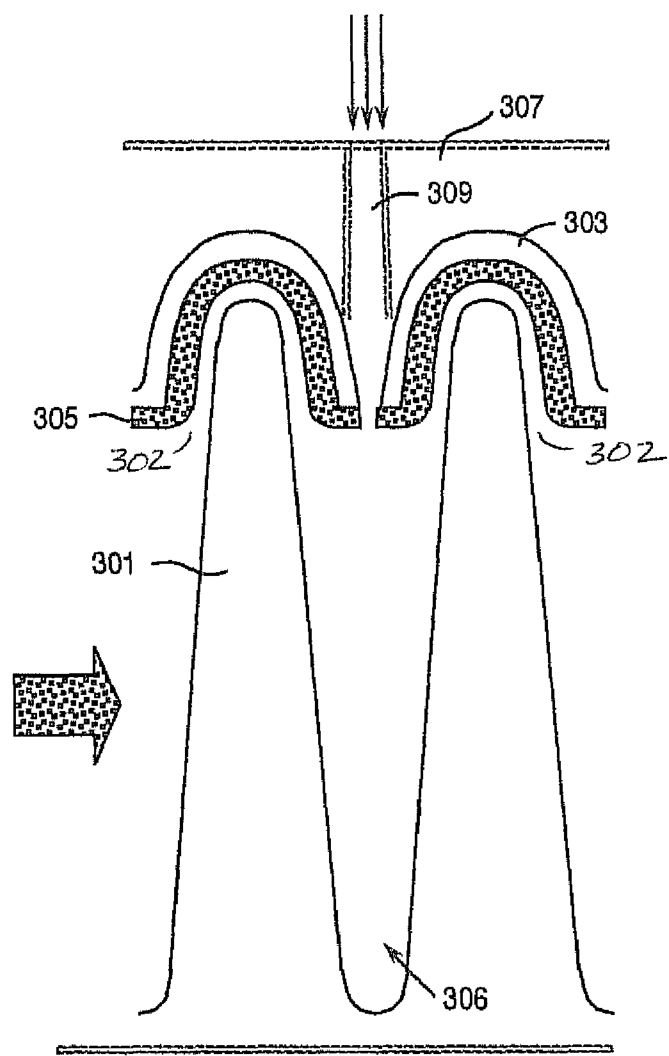
FIG. 3D shows a cross sectional view of the structure shown in FIG. 3C after an insulation film fill is formed to fill the space between portions of charge storage material that are formed inside a trench and non-conformal oxide portions that are formed on top of adjacent source-drain structures according to one embodiment.

As shown in FIG. 3D, subsequent to the execution of one or more operations that result in the cross section shown in FIG. 3C, an insulation film fill 309 is formed to fill the space between portions of charge storage material 305 formed inside trench 306 and the non-conformal oxide 307 that is formed above adjacent source-drain structures 301. In one embodiment, insulation film fill 309 can include but is not limited to ALD oxide or Si, Harp or eHARP, HTO, TEOS, HDP, BPSG, SOG, and undoped polysilicon. In other embodiments, other insulation film fill processes can be employed.

Figure 3E:
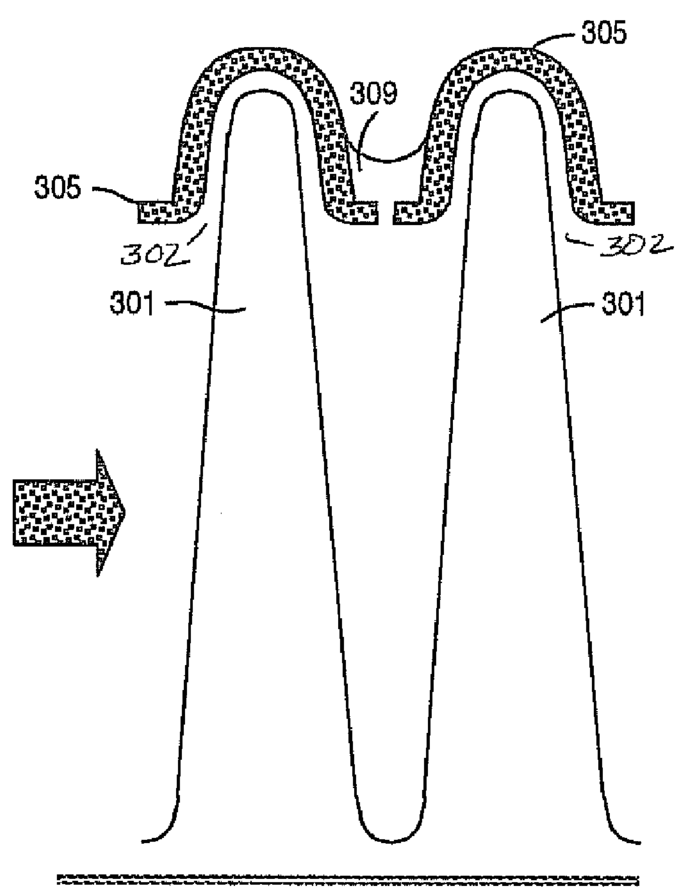
FIG. 3E shows a cross sectional view of the structure shown in FIG. 3D after a chemical mechanical polishing (CMP) and/or an etchback operation according to one embodiment.

As shown in FIG. 3E, subsequent to the execution of one or more operations that result in the cross section shown in FIG. 3D, a chemical-mechanical-polishing (CMP) and/or an etch-back is performed. In one embodiment, initially a CMP or dry etch may be performed to remove portions of planarized material, and subsequently a wet etch may be performed on the remaining material to produce the recessed cross section (e.g., in insulation film fill 309) that is shown in FIG. 3E.

Figure 3F:
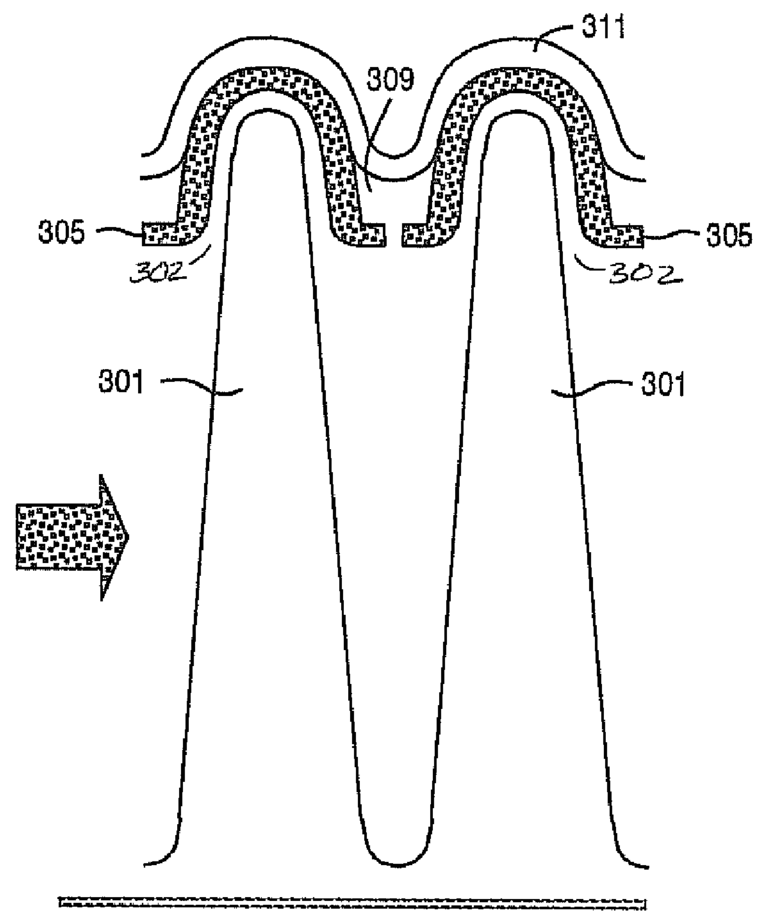
FIG. 3F shows a cross sectional view of the structure shown in FIG. 3E after a top oxide layer is formed according to one embodiment.

As shown in FIG. 3F, subsequent to the execution of one or more operations that result in the cross section shown in FIG. 3E, a top oxide 311 is formed above charge storage structure 305 and insulation film 309. In one embodiment, top oxide 311 is grown. In other embodiments, other techniques for forming top oxide 311 can be used.

Figure 3G:
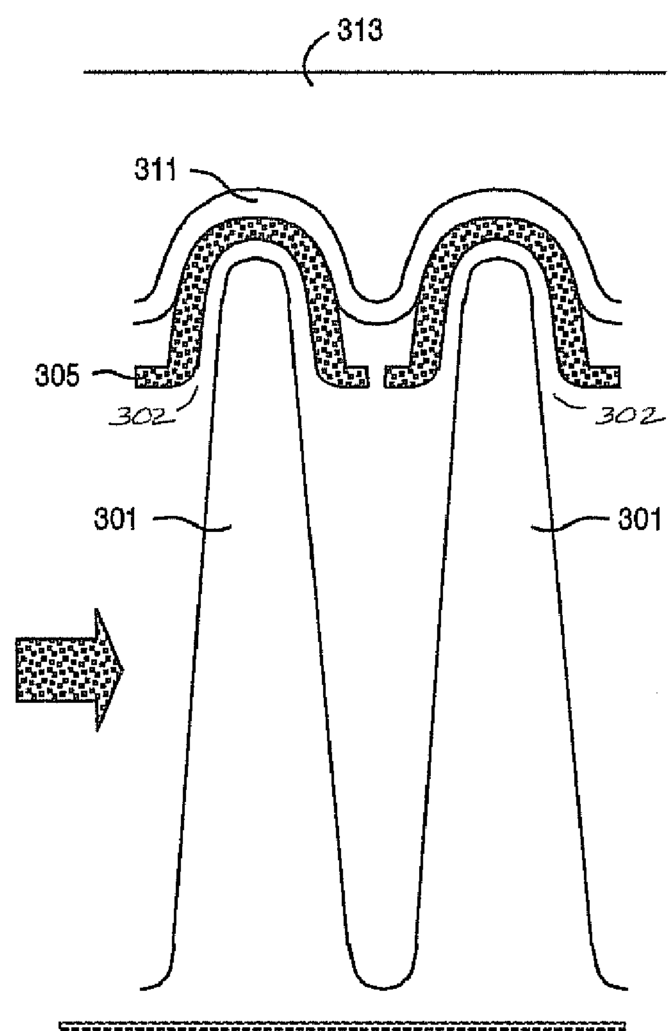
FIG. 3G shows a cross sectional view of the structure shown in 3F after a polysilicon layer is formed above the top oxide layer according to one embodiment.

As shown in FIG. 3G, subsequent to the execution of one or more operations that result in the cross section shown in FIG. 3F, a polysilicon layer 313 is formed above top oxide layer 311. In one embodiment, polysilicon layer 313 can be formed to extend into the trench to a depth of 100 to approximately 1500 angstroms.

Flowchart of Process Flow For Forming Memory Cells Having Top Oxide Spacer

Figure 4:
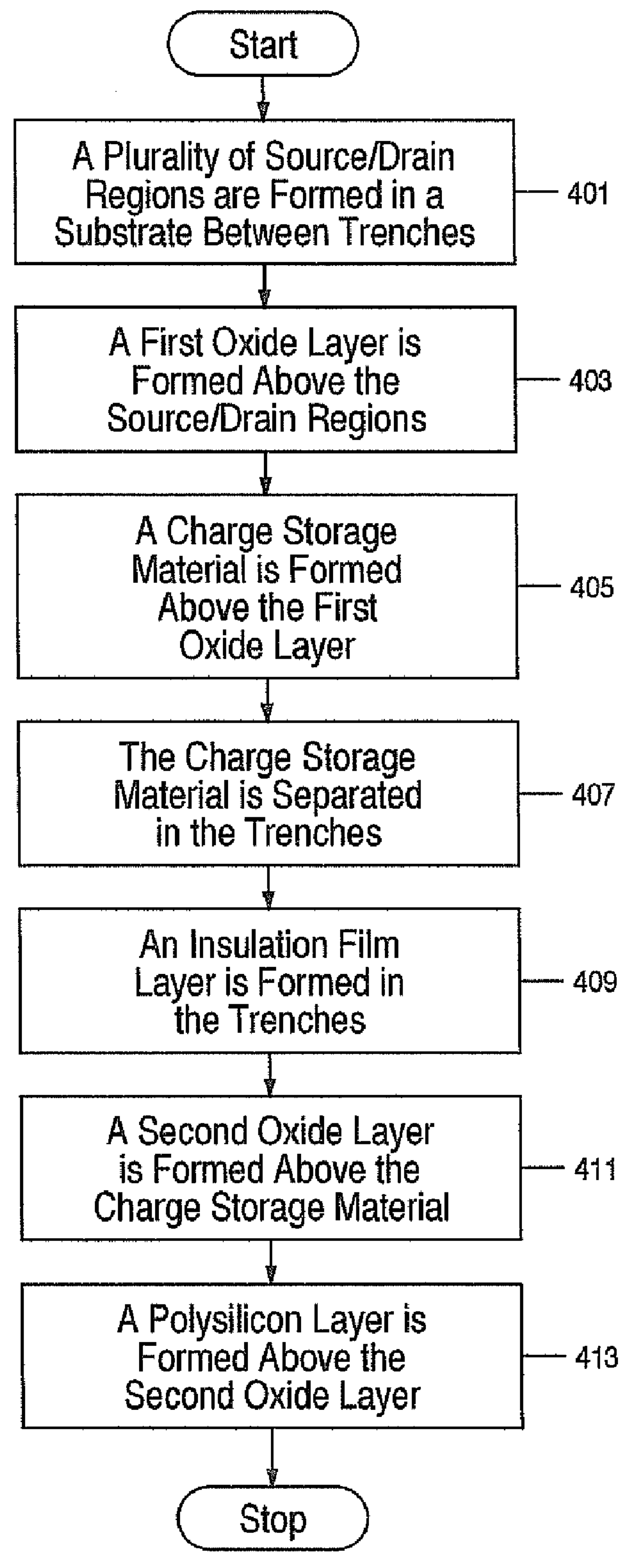
FIG. 4 shows a flowchart of a method for fabricating a semiconductor memory cell having a top oxide spacer according to one embodiment.

FIG. 4 shows a flowchart 400 of a method for fabricating a semiconductor memory cell having a top oxide spacer according to one embodiment. Although specific steps are disclosed in the flowchart, such steps are exemplary. That is the present invention is well suited to performing various other steps or variations of the steps recited in the flowchart.

At 401, a plurality of source-drain regions are formed in a substrate between trenches.

At 403, a first oxide layer is formed above the plurality of source-drain regions and in the trenches. In one embodiment, the first oxide layer forms a bottom oxide for a SONOS structure.

At 405, a charge storage material is formed above the first oxide layer. In one embodiment, the charge storage layer is formed from SiRN. In other embodiments, the charge storage layer can be formed from other types of materials.

At 407, the charge storage material is separated inside the trenches wherein a space is formed between the separated portions of the charge storage material. In one embodiment, the separation of the charge storage layer facilitates the isolation of respective memory cells that are associated with the respective separated portions of the charge storage material.

At 409, an insulation film fill layer is formed in the trenches to fill the space between separated portions of the charge storage material. In one embodiment, the insulation fill layer is formed such that it rises a predetermined distance above the space between portions of the charge storage material. In one embodiment, the insulation film fill layer constitutes a top oxide spacer element. In one embodiment, the thickness of the top oxide spacer can be 10 to approximately 1000 angstroms.

At 411, a second oxide layer is formed above the charge storage material. In one embodiment, the second oxide layer forms a top oxide layer of a SONOS structure.

At 413, a polysilicon layer is formed above the second oxide layer. In one embodiment, the polysilicon layer forms a wordline. In one embodiment, portions of the polysilicon layer can be formed to extend into the trenches to a depth of 100 to approximately 1500 angstroms.

With reference to exemplary embodiments thereof, methods for fabricating a semiconductor memory cell that has a spacer layer are disclosed. A method includes forming a plurality of source/drain regions in a substrate where the plurality of source/drain regions are formed between trenches, forming a first oxide layer above the plurality of source/drain regions and in the trenches, forming a charge storage layer above the oxide layer and separating the charge storage layer in the trenches where a space is formed between separated portions of the charge storage layer. The method further includes forming a spacer layer to fill the space between the separated portions of the charge storage layer and to rise a predetermined distance above the space. A second oxide layer is formed above the charge storage layer and the spacer layer and a polysilicon layer is formed above the second oxide layer.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

We claim:

1. A method for fabricating a semiconductor memory cell having a spacer layer comprising:

forming a plurality of source/drain regions in a substrate wherein said plurality of source/drain regions are formed between trenches;

forming a first oxide layer above said plurality of source/drain regions and in said trenches;

forming a charge storage layer above said first oxide layer;

separating said charge storage layer in said trenches wherein a space is formed between separated portions of said charge storage layer;

forming a spacer layer to fill said space between said separated portions of said charge storage layer and to rise a predetermined distance above said space;

forming a second oxide layer above said charge storage layer and above said spacer layer; and forming a polysilicon layer above said second oxide layer.

2. The method of claim 1 wherein said forming a spacer layer comprises using material selected from the group that includes ALD, HARP, eHARP, HTO, TEOS, HDP, BPSG, SOG, and un-doped poly.

3. The method of claim 1 wherein said forming a spacer layer comprises performing a CMP and/or etch back of material formed above said source/drain regions and in said trenches.

4. The method of claim 1 wherein said charge storage layer is formed from SiRN.

5. The method of claim 1 wherein said separating said charge storage layer is performed by etching.

6. The method of claim 1 wherein said polysilicon layer is formed by deposition.

7. The method of claim 1 wherein said trenches comprise STI trenches.

* * * * *